United States Patent
Tanaka et al.

[11] Patent Number: 5,418,213
[45] Date of Patent: May 23, 1995

[54] METHOD FOR FORMING CONTINUOUS OXIDE SUPERCONDUCTING LAYER HAVING DIFFERENCE THICKNESS PORTIONS FOR SUPERCONDUCTING DEVICE

[75] Inventors: Saburo Tanaka; Hideo Itozaki; Shuji Yazu, all of Itami, Japan

[73] Assignee: Sumitomo Electric Industries, Ltd., Osaka, Japan

[21] Appl. No.: 64,331

[22] Filed: May 18, 1993

Related U.S. Application Data

[63] Continuation of Ser. No. 593,162, Oct. 5, 1990, abandoned.

[30] Foreign Application Priority Data

Oct. 6, 1989 [JP] Japan ................... 1-261491
Nov. 15, 1989 [JP] Japan ................... 1-296740

[51] Int. Cl.$^6$ ........................................ H01L 21/00
[52] U.S. Cl. .................... 505/329; 505/728; 505/410; 216/3
[58] Field of Search ............ 505/728, 1; 156/643, 156/656, 655, 651, 652, 659.1, 661.1

[56] References Cited

U.S. PATENT DOCUMENTS 5,041,188 8/1991 Myrosznyk et al. ........... 505/728 X
5,047,390 9/1991 Higashino et al. .............. 505/1

FOREIGN PATENT DOCUMENTS 0366949 5/1990 European Pat. Off. .
0397186 5/1990 European Pat. Off. .

OTHER PUBLICATIONS

H. Tsuge et al. "Microfabrication processes for high-Tc superconducting films", 1989 Proceedings of the 39th Electronic Components Conference, vol. 39, May 28, 1989, pp. 7–12.

M. G. Blamire, et al., "Fabrication and properties of superconducting device structures in $YBa_2Cu_3O_{7-x}$ thin films" Journal of Physics D:Applied Physics vol. 20, No. 10, Oct. 14, 1987, pp. 1330–1335.

Fisanick et al, "CW Laser Etching of $Ba_2YCu_3O_7$ Films", American Institute of Physics, pp. 189–196, 1988.

*Primary Examiner*—Thi Dang
*Attorney, Agent, or Firm*—Pennie & Edmonds

[57] ABSTRACT

A method for forming an oxide superconductor thin film having different thickness portions, in a process for manufacturing a superconductor device, includes the step of forming an oxide superconductor thin film having a uniform thickness on a substrates. A portion of the oxide superconductor thin film is etch-removed so that the oxide superconductor thin film has a thin thickness portion. Preferably, before the etching, the oxide superconductor thin film is coated with a metal layer, and the oxide superconductor thin film and the metal layer are etched together by means of a physical dry etching process.

4 Claims, 3 Drawing Sheets

5,418,213

METHOD FOR FORMING CONTINUOUS OXIDE SUPERCONDUCTING LAYER HAVING DIFFERENCE THICKNESS PORTIONS FOR SUPERCONDUCTING DEVICE

This is a continuation of application Ser. No. 07/593,162, filed Oct. 5, 1990, now abandoned.

BACKGROUND OF THE INVENTION

1. Field of the invention

The present invention relates to a method for manufacturing a superconductor device, and more specifically to a method for forming an oxide superconductor thin film having different thickness portions, in a process for manufacturing a superconductor device.

2. Description of related art

In a process of manufacturing superconductor devices such as Josephson devices and superconductor transistors, it is necessary to form a superconductor in the form of a thin film, and to work the superconductor thin film into a desired shape.

When a superconductor used in the superconductor devices is composed of an oxide superconductor such as Y—Ba—Cu—O oxide superconductor typified by $Y_1Ba_2Cu_3O_x$, Bi—Sr—Ca—Cu—O oxide superconductor typified by $Bi_2Sr_2Ca_2Cu_3O_y$, and Tl—Ba—Ca—Cu—O oxide superconductor typified by $Tl_2Ba_2Ca_2Cu_3O_z$, formation and working of the thin film have been performed as follows:

In an ordinary practice, a thin film of an oxide superconductor is formed by using a physical vapor deposition process such as a sputtering and molecular beam epitaxy, or a chemical vapor deposition process such as metal organic chemical vapor deposition (MO-CVD). After formation of the thin film, a heat treatment can be performed in order to improve characteristics of the oxide superconductor thin film. Regardless of the kind of the thin film formation process, it is necessary to unify the crystal orientation in the formed oxide superconductor thin film. The reason for this is that the above mentioned oxide superconductor generally has directivity in superconduction critical current density.

In the case of forming an oxide superconductor thin film having different thickness portions, a thin film having a thickness equal to the thickness of the thinnest thickness portion of the different thickness portions is first formed, and thereafter, a mask is deposited on a portion to be left as the thinnest portion, and an oxide superconductor is further deposited on the thin film having a thickness equal to the thinnest thickness.

In the following, there will be explained an example of a conventional process for forming on a substrate an oxide superconductor thin film having a central portion of 400 nm thickness and opposite side portions of 100 nm thickness. First, an oxide superconductor thin film having a thickness of 100 nm is formed on the substrate by sputtering or another process. A portion of the thus deposited oxide superconductor thin film other than a central portion is masked with a photoresist, and an oxide superconductor is further deposited by sputtering or another thickness, so that the central portion is constituted of an oxide superconductor thin film having a thickness of 400 nm.

As seen from the above, the conventional process is featured in which an oxide superconductor thin film having a thickness of the thinnest thickness portion is formed on a whole surface of the substrate, and thereafter, an unnecessary portion of the formed oxide superconductor thin film is covered with a mask and an oxide superconductor is selectively further deposited on only a required portion of the formed oxide superconductor thin film. As a result, the oxide superconductor thin film having different thickness portions is formed.

The above mentioned process has been disadvantageous in that reaction occurs at an boundary between a photoresist used as the mask and a firstly formed oxide superconductor thin film, so that the characteristics of the oxide superconductor is deteriorated. In a photolithography process, a surface of the first formed oxide superconductor thin film is in contact with an alkaline developing liquid, a resist removing liquid and a cleaning water. An upper oxide superconductor layer is deposited on the surface of the lower oxide superconductor thin film which had once been in contact with these kinds of liquid. In this case, a discontinuous boundary is formed between the upper oxide superconductor layer and the lower oxide superconductor thin film, and a uniform oxide superconductor thin film having a thick portion and a thin portion cannot be obtained.

SUMMARY OF THE INVENTION

Accordingly, it is an object of the present invention to provide a method for working an oxide superconductor thin film without deteriorating characteristics of the oxide superconductor, which method has overcome the above mentioned defects in the conventional oxide superconductor device manufacturing process.

The above and other objects of the present invention are achieved in accordance with the present: invention by a method for forming an oxide superconductor thin film having different thickness portions, in a process for manufacturing a superconductor device, the method including the step of etching a portion of the oxide superconductor thin film so that the oxide superconductor thin film has a thin thickness portion.

According to another aspect of the present invention, an oxide superconductor thin film is formed on a substrate, and a portion of the oxide superconductor thin film formed on the substrate is etched so that a convex portion having a thickness larger than a peripheral thin portion and having a contour defined by the peripheral thin portion is formed. At least a portion of an oxide superconductor thin film device is formed in the convex portion.

The above mentioned method in accordance with the present invention is characterized in that only a portion of a relatively thick oxide superconductor thin film formed on a whole is etched so as to have a reduced thickness, in order to form an oxide superconductor thin film having different thickness portions in the process for manufacturing a superconductor device. Accordingly, in the case of forming an oxide superconductor thin film having different thickness portions on a given surface in accordance with the present invention, growth of an oxide superconductor thin film on the given surface can be performed in one step. Namely, an oxide superconductor thin film having a thickness equal to that of the thickest portion of the oxide superconductor thin film having different thickness portions is formed with the one step. Thereafter, a thin portion and/or unnecessary portion is formed or removed by electively etching the oxide superconductor thin film having the thickness equal to that of the thickest portion.

The fact that the growth of an oxide superconductor thin film on the given surface is performed in one step, means that a single continuous or integral layer or sheet of an oxide superconductor thin film is grown in one step. Therefore, for a structure in which a non-superconductor is integrally sandwiched between a pair of superconductor thin films, for example a tunnel junction type superconducting weak link structure, a required number of superconductor thin films are formed in a single continuous step. In addition, in the oxide superconductor thin film of a stacked-layer structure in which a plurality of layers of oxide superconductor thin films and a non-superconductor thin film are stacked, these layers are preferably formed in a manner that the substrate is never taken out of a chamber of a film formation or deposition device until an uppermost layer is deposited, so that the oxide superconductor will never be contacted with air in the course of the oxide superconductor thin film formation process.

In the method in accordance with the present invention, since the growth of the thin film is performed in one step, a uniform oxide superconductor thin film having a good crystalline condition can be obtained. Therefore, in case of forming a junction such as superconducting weak link junction between an oxide superconductor thin film and another thin film, not only a uniform oxide superconductor thin film having a good crystalline condition can be obtained, but also a good boundary can be formed at the junction portion.

The superconduction property of the oxide superconductor thin film is greatly influenced by a crystalline orientation and composition. Therefore, an oxide superconductor thin film formed by many times of separate deposition cannot have a continuous crystal, and a boundary adversely occurs, with the result that a uniform superconduction property cannot be obtained. Needless to say, this oxide superconductor thin film is not suitable to form a superconducting weak link junction. The characteristics of the superconducting weak link junction is also greatly influenced by a condition of boundary in the junction portion. Particularly, if a surface or portion to be brought into the boundary is contacted with air in the manufacturing process and the surface condition is caused to adversely change, a desired characteristics of the superconducting weak link junction cannot be obtained. However, if the method in accordance with the present invention is used, this problem can be overcome.

The method in accordance with the present invention can be applied to any type of oxide superconductor. For example, the present invention can be applied to Y—Ba—Cu—O oxide superconductor typified by $Y_1Ba_2Cu_3O_x$ ($6<x\leq7$), Bi—Sr—Ca—Cu—O oxide superconductor typified by $Bi_2Sr_2Ca_2Cu_3O_y$ ($7\leq y\leq10$), and Tl—Ba—Ca—Cu—O oxide superconductor typified by $Tl_2Ba_2Ca_2Cu_3O_z$ ($7\leq z\leq10$). However, it should be noted that the present invention is in no way limited to these oxide superconductors.

Furthermore, in the method of the present invention, the etching is preferably performed by a dry etching process, for example, an ion beam etching using inert gas such as Ar (argon), an ECR (electron cycroton resonance) etching, an RF (radio frequency) plasma etching, etc. These etching processes are very preferable, since a physical etching is realized by charged particles without chemical reaction, and therefore with less influence to the oxide superconductor. In the case of the Ar ion beam etching, an acceleration voltage for Ar-ions is preferred to be in a range of 600 V to 800 V. If the acceleration voltage is less than 600 V, the time for etching becomes too long, and if the acceleration voltage is greater than 800 V, the oxide superconductor crystal of a region in proximity of a surface is destroyed.

In the method of the present invention, after formation of the uniform oxide superconductor thin film, a surface of the oxide superconductor thin film is preferably protected by covering the thin film surface with a film of metal which does not give an adverse influence to the oxide superconductor. This is particularly advantageous in the case of performing the etching after patterning a mask by use of a photolithography. If the oxide superconductor thin film surface is covered with the metal film, the oxide superconductor thin film will never be contacted with an alkaline developing liquid, a resist removing liquid and a cleaning water which are used in the photolithography process of the mask patterning. Therefore, even after the shaping of the oxide superconductor thin film, the superconducting characteristics will be not deteriorated. The metal used as the protection metal film is preferably Ag (silver), since Ag is remarkably low in reactivity to the oxide superconductor, and since Ag has a low contact resistance with the oxide superconductor and an excellent adhesion or bonding property to the oxide superconductor. However, it is possible to use, as the metal for the protection metal film, a metal material having a low reactivity to oxide superconductors, for example, Al, In, Zn, Cu, Ni, Au, Pt, Ti, Pd, etc. In addition, the protection metal film can be formed by means of an evaporation process.

The above and other objects, features and advantages of the present invention will be apparent from the following description of preferred embodiments of the invention with reference to the accompanying drawings. However, the examples explained hereinafter are only for illustration of the present invention, and therefore, it should be understood that the present invention is in no way limited to the following examples.

DESCRIPTION OF THE PREFERRED EMBODIMENTS

Oxide superconductor thin films were worked in accordance with the method of the present invention, and superconducting characteristics of the worked oxide superconductor thin films was measured.

First, the process of the method of the present invention will be described with reference to FIGS. 1A to 1D, which illustrate the process for forming on a substrate an oxide superconductor thin film having a central portion of 400 nm thickness and opposite side portions of 100 nm thickness, similarly to that formed in the conventional process explained hereinbefore.

Figure 1A:
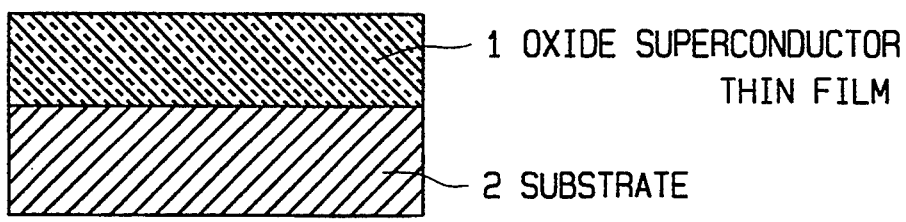
FIG. 1A to 1D are diagrammatic section views illustrating the process in accordance with the present invention for working an oxide superconductor thin film.
Figure 1B:
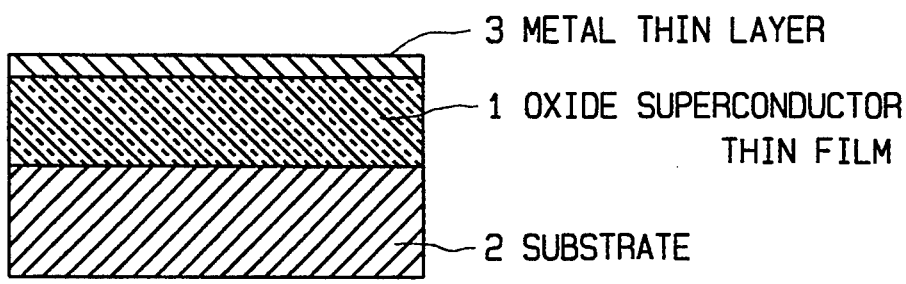
Figure 1C:
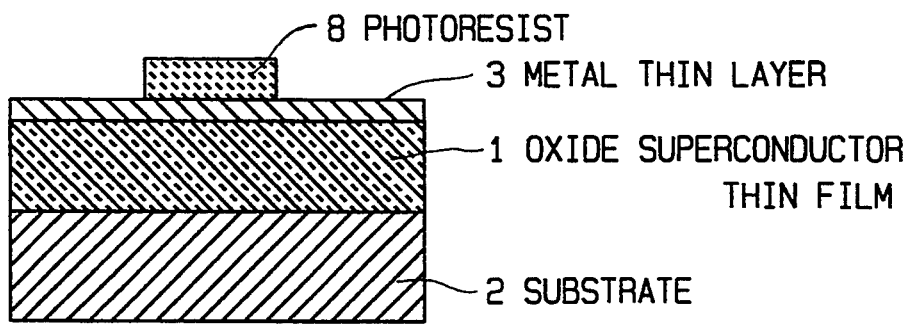
Figure 1D:
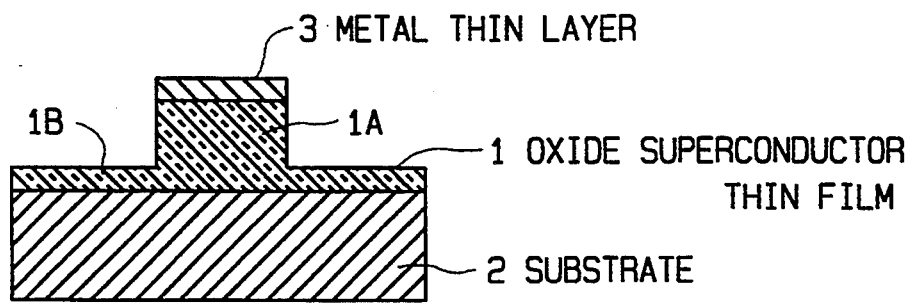

First, as shown in FIG. 1A, an oxide superconductor thin film 1 having a thickness of 400 nm was formed on a substrate 2 by sputtering. As shown in FIG. 1B, a metal film 3 of 100 nm thickness was formed on an upper surface of the oxide superconductor thin film 1 by a vacuum evaporation process. Thereafter, as shown in FIG. 1C, a photoresist mask 8 was formed on a central portion of the metal film 3. Then, Ar-ion beam etching was performed using the photoresist layer 8 as a mask, until opposite side portions of the oxide superconductor thin film 1 have a thickness of 100 nm, as shown in FIG. 1D. The present invention is characterized in that the oxide superconductor thin film 1 and the metal layer 3 coating the oxide superconductor thin film 1 are etched into a trapezoid in section so that a thick portion 1A is composed of the oxide superconductor thin film 1 and the metal layer 3 coating the oxide superconductor thin film 1 and a thin portion 1B is located at each side of the thick portion 1A and is composed of only a thickness-reduced oxide superconductor thin film having an upper surface which is not covered with the metal layer 3.

A remaining photoresist mask 8 is ashed by using $O_2$ plasma, so that the remaining photoresist mask 8 is completely removed. With removal of the remaining photoresist mask 8 by a dry process, the oxide superconductor thin film 1 will in no way be in contact with a photoresist removing liquid and a cleaning water.

Thus, the oxide superconductor thin film having a thick portion 1A and a thin portion 1B is formed. For example, a superconducting device is formed on or in the thick portion 1A, and the thin portion 1B constitutes a lower side electrode of the superconducting device, or a lead conductor from the thick portion 1A. In this case, an electrode or contact for connection is formed on the thin portion 1B.

The oxide superconductor thin film 1 was formed of $Y_1Ba_2Cu_3O_x$ oxide superconductor, $Bi_2Sr_2Ca_2Cu_3O_y$ oxide superconductor and $Tl_2Ba_2Ca_2Cu_3O_z$ oxide superconductor, respectively. A MgO single crystalline substrate (100) is used as the substrate 2. The metal film 3 was formed of Au (gold).

For comparison, oxide superconductor thin films having the same shape were formed in accordance with the conventional method explained hereinbefore, and the superconducting characteristics of these thin films were measured. The following table shows the superconducting characteristics of the oxide superconductor thin films worked in accordance with the present invention method and in accordance with the conventional method.

|  | Superconductor Thin Film | Tc(K) | Jc(A/cm$^2$) |
|---|---|---|---|
| Invention | $Y_1Ba_2Cu_3O_x$ | 89 | $1.0 \times 10^6$ |
|  | $Bi_2Sr_2Ca_2Cu_3O_y$ | 103 | $7.0 \times 10^5$ |
|  | $Tl_2Ba_2Ca_2Cu_3O_z$ | 110 | $3.8 \times 10^5$ |
| Comparative | $Y_1Ba_2Cu_3O_x$ | 79 | $4.0 \times 10^5$ |
|  | $Bi_2Sr_2Ca_2Cu_3O_y$ | 80 | $1.0 \times 10^5$ |
|  | $Tl_2Ba_2Ca_2Cu_3O_z$ | 90 | $3.0 \times 10^4$ |

(Measurement of a critical current Jc was made at 77.3K)

As seen from the above table, the oxide superconductor thin films worked in accordance with the present invention method have the superconducting characteristics more excellent than the conventional ones.

Figure 2:
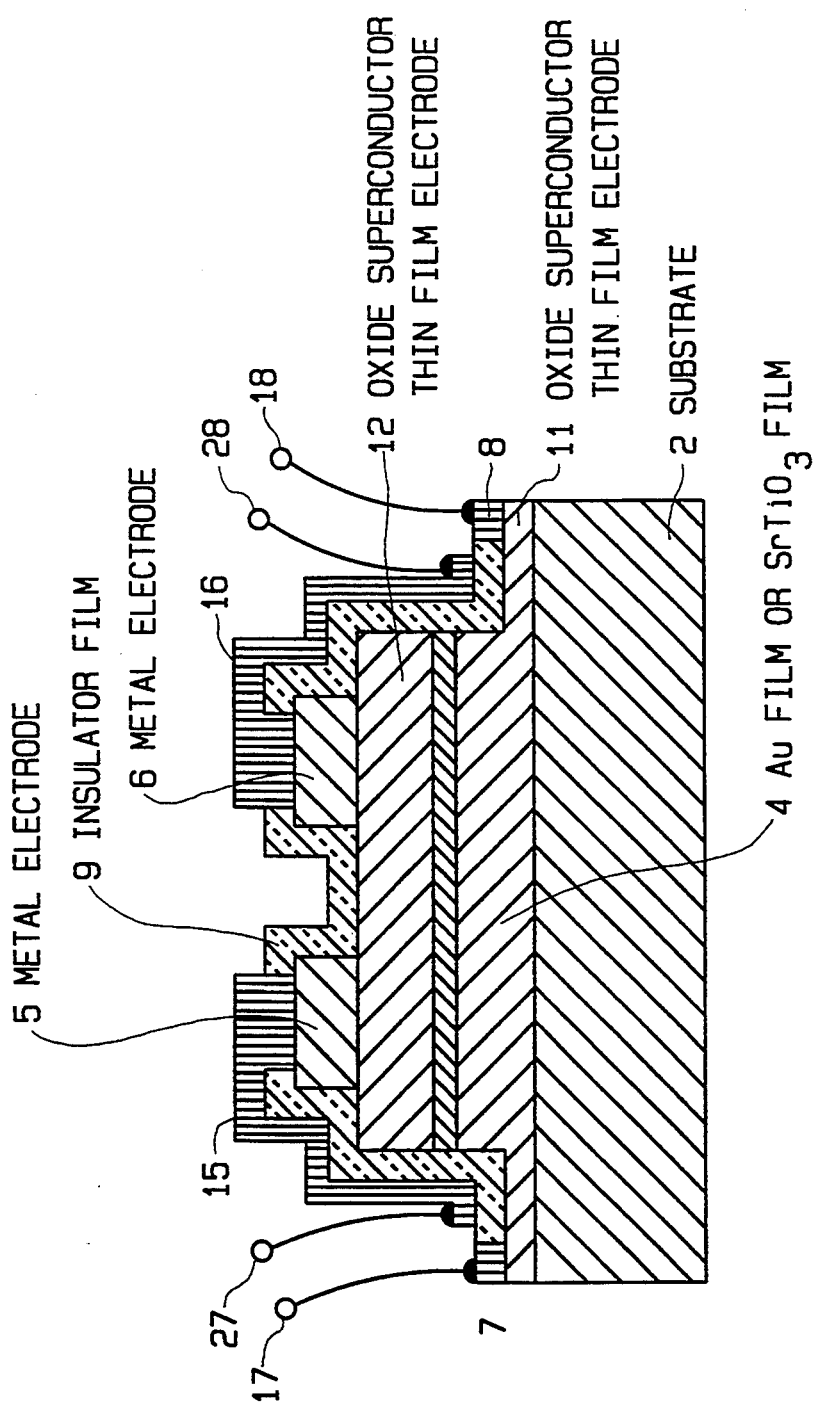
FIG. 2 is a diagrammatic section view illustrating one example of a superconducting device formed by utilizing the method in accordance with the present invention.

Referring to FIG. 2, there is shown a diagrammatic section view illustrating one example of a superconducting device formed by utilizing the method in accordance with the present invention. The superconducting device shown in FIG. 2 is a so-called Josephson mixer. The shown device includes a first superconducting electrode 11 formed of $Y_1Ba_2Cu_3O_x$ thin film formed on a MgO substrate 2, an Au thin layer 4 formed on a central portion of the first superconducting electrode 11, and a second superconducting electrode 12 formed of $Y_1Ba_2Cu_3O_x$ thin film formed on the Au thin layer 4 without directly contacting with the first superconducting electrode 11. A pair of metal electrodes 5 and 6 are located on the second superconducting electrode 12. In addition, another pair of metal electrodes 7 and 8 having connecting terminals 17 and 18, respectively, are provided respectively on opposite end portions of the first superconducting electrode 11 on which the Au layer 4 is not formed. The metal electrodes 5 and 6 excluding an upper surface thereof are covered with an insulating layer 9, and metal layers 15 and 16 are formed on the insulating layer 9 so as to extend from the upper surfaces of the metal electrode 5 and 6 and to be connected to connecting terminals 27 and 28 in proximity of the metal electrodes 7 and 8, respectively.

In the above mentioned superconducting device, the maximum thickness of each of the first and second superconducting electrodes 11 and 12 was 400 nm, and the thickness of the Au layer 4 was 10 nm. In addition, the metal electrodes 5 and 6 formed on the second superconducting electrode 12 were formed in a double-layered structure having an lower layer of Ag in contact with the second superconducting electrode 12 and an upper layer Au formed on the Ag lower layer. This double-layered metal electrode does not give an adverse influence to the compound oxide superconductor, and has an excellent adhesion or bonding property to the compound oxide superconductor.

Now, a process for forming the above mentioned superconducting device will be explained with reference to FIGS. 3A to 3G.

Figure 3A:
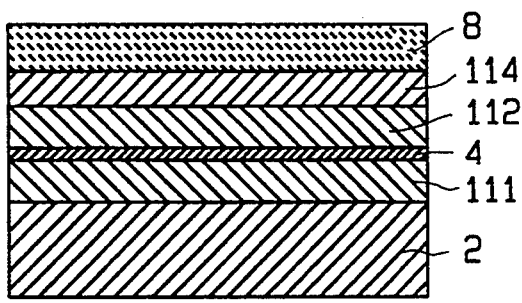
FIGS. 3A to 3G are diagrammatic section views illustrating the process for manufacturing the superconducting device shown in FIG. 2.

As shown in FIG. 3A, a first $Y_1Ba_2Cu_3O_x$ superconductor thin film 111, an Au layer 4, a second $Y_1Ba_2Cu_3O_x$ superconductor thin film 112 and a metal layer 114 were formed on the MgO substrate 2 in the named order in such a manner that each layer completely covers an upper surface of a just-lower layer. The first $Y_1Ba_2Cu_3O_x$ superconductor thin film 111 and the second $Y_1Ba_2Cu_3O_x$ superconductor thin film 112 were deposited to have a thickness of 400 nm by sputtering, respectively. The Au layer 4 was deposited to have a thickness of 10 nm by vacuum evaporation. The metal layer 114 was formed by depositing an Ag layer of 150 nm thickness by vacuum evaporation and also depositing an Au layer of 150 nm thickness on the Ag layer by vacuum evaporation. Thereafter, a photoresist layer 8 is deposited on the metal layer 114, as shown in FIG. 3A.

Figure 3B:
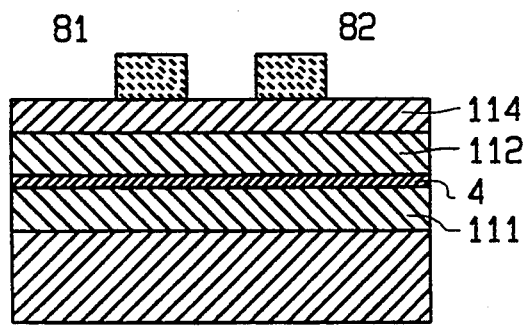
Figure 3C:
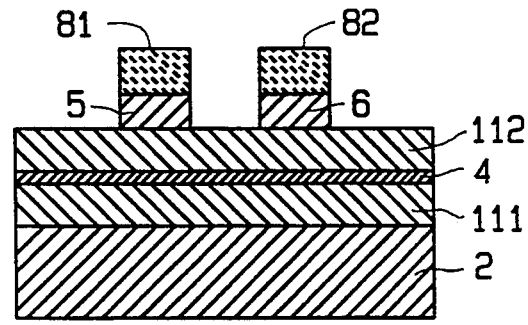

Then, as shown in FIG. 3B, the photoresist layer 114 was patterned so that resist masks 81 and 82 are left on portions of the metal layer 114 which become the metal electrodes in future. Ar-ion etching was performed by using the remaining resists 81 and 82 as a mask, so that the metal layer 114 not covered with the remaining resists 81 and 82 are completely removed. As a result, the metal electrodes 5 and 6 are formed as shown in FIG. 3C.

Figure 3D:
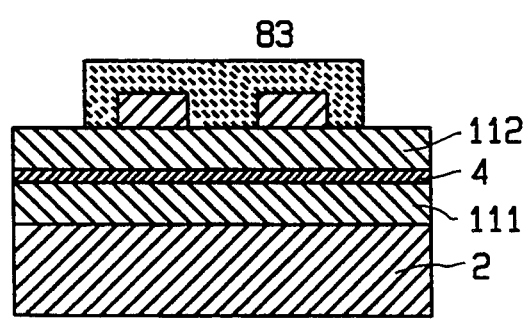
Figure 3E:
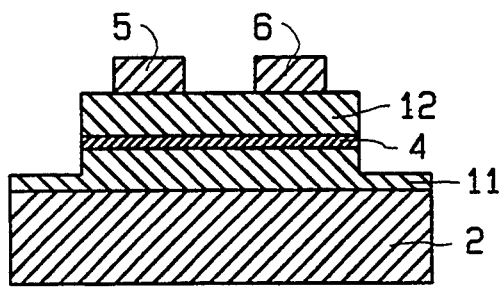

Thereafter, as shown in FIG. 3D, a photoresist layer 83 is deposited on the second $Y_1Ba_2Cu_3O_x$ superconductor thin film 112 so as to cover the metal electrodes 5 and 6. Again, Ar-ion etching was performed by using the photoresist 83 as a mask, so that the second $Y_1Ba_2Cu_3O_x$ superconductor thin film 112 and the Au layer 4 which are not covered with the photoresist 83, were completely removed, and the first $Y_1Ba_2Cu_3O_x$ superconductor thin film 111 which is not covered with the photoresist 83, was partially removed, with the result that the first superconducting electrode 11 and the second superconducting electrode 12 are formed as shown in FIG. 3E.

Figure 3F:
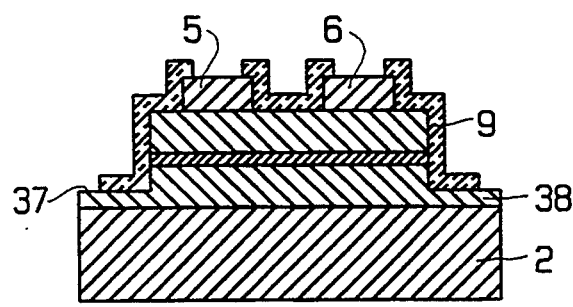

Furthermore, as shown in FIG. 3F, an insulating layer 9 is formed to cover portions excluding opposite end portions 37 and 38 of the first superconducting electrode 11 and an upper surface of each of the metal electrodes 5 and 6.

Figure 3G:
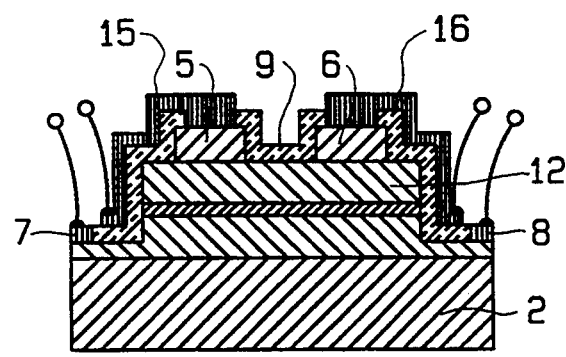

As shown in FIG. 3G, metal electrodes 7 and 8 are formed on exposed opposite end portions 37 and 38 of the first superconducting electrode 11, and metal layers 15 and 16 are formed to cover the upper surface of the metal electrodes 5 and 6 and to extend from the upper surface of the metal electrodes 5 and 6 on the surface of the insulating layer 9. Thus, the superconducting device shown in FIG. 2 is completed.

At a temperature of 40K, the above mentioned superconducting device responded to a microwave of 9 GHz and stably operated with a clear Shapiro step.

In the superconducting device shown in FIG. 2, the Au layer 4 can be replaced with a $SrTiO_3$ layer of 1 nm thickness. This superconducting device can be formed by depositing the $SrTiO_3$ layer of 1 nm thickness on the first $Y_1Ba_2Cu_3O_x$ superconductor thin film 111 by sputtering, in place of depositing the Au layer 4, when the stacked structure illustrated in FIG. 3A is formed.

As seen from the above description, the method in accordance with the present invention can work an oxide superconductor thin film without deteriorating characteristics of the oxide superconductor. Therefore, the method in accordance with the present invention makes it easy to form a superconducting device by a fine working of a superconductor thin film, and therefore, utilization of superconduction technique is further facilitated.

The invention has thus been shown and described with reference to the specific embodiments. However, it should be noted that the present invention is in no way limited to the details of the illustrated structures but changes and modifications may be made within the scope of the appended claims.

We claim:

1. A process for manufacturing a Josephson junction superconducting device which includes a metal barrier layer sandwiched between a pair of oxide superconductor thin films layers, said process comprising the steps of:

depositing a first oxide superconductor thin film layer over a surface of a substrate;

depositing a first metal layer over a surface of the first oxide superconductor thin film layer;

depositing a second oxide superconductor thin film layer over a surface of the first metal layer;

depositing a second metal layer over a surface of the second oxide superconducting thin film layer;

forming a resist pattern on a surface of the second metal layer wherein a portion of the second metal layer is covered with said resist;

removing an exposed portion of said second metal layer such that said covered portion of the second metal layer forms a first electrode;

forming a resist pattern over a portion of a surface of the second oxide superconductor thin film layer wherein said resist layer completely covers said first electrode and leaves a portion of the second oxide superconductor thin film layer exposed;

forming a Josephson junction by removing the portion of the second oxide superconductor thin film layer that is exposed and not covered by said resist pattern, a portion of the first metal layer, and a portion of the first oxide superconductor thin film layer; and forming a second electrode on an exposed portion of the first oxide superconductor thin film layer.

2. The process for manufacturing a Josephson junction superconducting device according to claim 1 wherein an insulating layer is formed to cover all the surface area of the device except the portion of said first oxide superconductor thin film layer for said second electrode and the portion of said first electrode.

3. The process for manufacturing a Josephson junction superconducting device according to claim 1 wherein metal layers are formed to cover said first electrode and at least a portion of an upper surface of said insulating layer.

4. The process for manufacturing a Josephson junction superconducting device according to claim 1 wherein each of said first and second oxide superconductor thin films consists of $Y_1Ba_2Cu_3O_x$ ($6<x\leq7$), $Bi_2Sr_2Ca_2Cu_3O_y$ ($7\leq y\leq10$), or $Tl_2Ba_2Ca_2Cu_3O_z$ ($7\leq z\leq10$).

* * * * *